US007642767B2

(12) United States Patent
Willis

(10) Patent No.: US 7,642,767 B2
(45) Date of Patent: Jan. 5, 2010

(54) METHOD AND APPARATUS FOR MEASURING DUTY CYCLE

(75) Inventor: Andre Willis, Menlo Park, CA (US)

(73) Assignee: Synthesys Research, Inc, Menlo Park, CA (US)

( * ) Notice: Subject to any disclaimer, the term of this patent is extended or adjusted under 35 U.S.C. 154(b) by 0 days.

(21) Appl. No.: 11/371,316

(22) Filed: Mar. 7, 2006

(65) Prior Publication Data

US 2008/0013668 A1 Jan. 17, 2008

(51) Int. Cl.
*G01R 13/02* (2006.01)
(52) U.S. Cl. .................. 324/76.47; 375/355; 702/78; 702/69; 327/175
(58) Field of Classification Search ........... 324/76.47
See application file for complete search history.

(56) References Cited

U.S. PATENT DOCUMENTS

| | | | | |
|---|---|---|---|---|
| 4,696,019 | A * | 9/1987 | Tulpule et al. ............. | 375/356 |
| 6,226,491 | B1 * | 5/2001 | Wachs et al. .............. | 455/12.1 |
| 6,404,834 | B1 * | 6/2002 | Hardin et al. .............. | 375/376 |
| 6,760,739 | B2 * | 7/2004 | Takahashi ................. | 708/250 |
| 6,957,087 | B1 * | 10/2005 | Hedberg ................... | 455/561 |
| 7,437,633 | B1 * | 10/2008 | Lesea et al. ............... | 714/725 |
| 2004/0056794 | A1 * | 3/2004 | Erkocevic-Pribic ......... | 342/196 |
| 2004/0122608 | A1 * | 6/2004 | Levin ..................... | 702/77 |
| 2005/0088184 | A1 * | 4/2005 | Burdick et al. ............ | 324/658 |
| 2005/0168256 | A1 * | 8/2005 | Schrodinger .............. | 327/175 |

OTHER PUBLICATIONS

Texas Instruments CMOS Counter/Dividers, CD4071B, CD4022B Types Data Sheet, Copyright 2004, Texas Instruments, Inc., p. 1.*
Texas Instruments CD54HC74 etc. Dual D Flip-Flop with Set and Reset, Postive Edge Trigger, Data sheet, Copyright 2003, Texas Instruments, Inc., p. 1.*

* cited by examiner

*Primary Examiner*—Timothy J Dole
*Assistant Examiner*—Benjamin M Baldridge
(74) *Attorney, Agent, or Firm*—Peninsula IP Group; Douglas Chaikin

(57) ABSTRACT

Disclosed herein is a method and apparatus used to the measure duty cycle of a clocking waveform utilizing minimal hardware and achieving high accuracy. This invention utilizes digital sampling of the signal to be measured at a rate that can be significantly lower then the clocking frequency of the signal to be measured. It accomplishes broad-band, multi-frequency use by using a time-varying frequency for the sampling clock to make sure that the sampling clock is asynchronous with the frequency of the clocking signal to be measured. The average ratio of the sampled ones (or zeros) as compared to the total number of samples is then computed to derive the measurement of duty cycle.

18 Claims, 1 Drawing Sheet

RANDOMIZED DUTY CYCLE MEASUREMENTS

RANDOMIZED DUTY CYCLE MEASUREMENTS

FREQ. SPECTRUM OF NORMAL SAMPLING OSCILLATOR

EXAMPLES OF IRREGULAR SAMPLING OSCILLATORS

METHOD AND APPARATUS FOR MEASURING DUTY CYCLE

BACKGROUND OF THE INVENTION

1. Field of the Invention

This invention relates to systems which measure the duty cycle of a periodic signal. More particularly, this invention relates to a circuit and various components which measure the duty cycle of a periodic signal with great accuracy.

2. Description of the Related Art

The duty cycle, in electronic signals, is often expressed as a percentage of duration of a 1-level compared to the total duration of a complete 1-0 cycle. The duty cycle is an expression of the average DC energy of a clocking signal introduced by the duty cycle. A 50% duty cycle has average DC energy of one-half the difference of the 1-level and the 0-level as there is an equal duration of 1-level signal and 0-level signal. The duty cycle in clocking waveforms is also a measure of second harmonic energy in a clocking signal which can appear as a deterministic jitter source from odd-even pulse widths in the clocking signal. Both interpretations can lead to non-optimal performance of very high speed signal processing if the duty cycle deviates from tolerable levels. For this reason, means for measuring duty cycle to support corrective actions are needed.

During the production of many high-speed systems, special care and calibrations are done to make sure good duty cycles are present within the processing elements. In some systems, however, the application space is so broad, that it is not possible to use factory calibration information as it is not relevant to the then current environment. This is true, for example, where operation of a device is specified for a wide range of operating frequencies and a wide range of temperatures. In these cases, automatic measurement of the duty cycle at various spots within the electronic processing path must be supported. In this fashion, once the system is in the operating environment, the calibration procedure can be invoked to take corrective actions appropriate for the given environment without external probing or outside test equipment. For this to be practical, very high performance duty cycle measuring circuits must be implemented with a small amount of electronics and must be able to make high-quality duty cycle measurements in a short amount of time.

Past methods for measuring duty cycle typically involved using an oscilloscope device to observe the waveform shape and then, firmware in the oscilloscope would interpret the waveform data to compute the duty cycle number. This high-performance means of accurately measuring duty cycle requires expensive external test equipment, access to the testing points and a relatively constant operating environment suitable for reliably applying pre-computed corrective action based on relatively infrequent actual calibration information.

Cruder methods for measuring duty cycle are accomplished by measuring the DC voltage of a high-speed signal and then applying a low-pass filter to average the result. For well-shaped repetitive signal with binary 1 and 0 values encoded, the duty cycle value is given by comparing the DC1-level and DC 0-level to the average measured DC voltage. For example, if a 1-level was 1000 mV and a 0-level was 0 mV, then a measured averaged DC voltage of 500 mV (mid-way) might be thought to indicate a 50% duty cycle. The problem with this method is that it assumes well-shaped waveforms. If there is a variation in waveform shape for 1-levels and 0-levels (something that is common in modern high-speed electronics), for example, caused by variation in rise-time versus fall-time, then a 500 mV averaged DC voltage might have been caused by a condition other than a 50% duty cycle. That is, a 50% voltage average does not necessarily indicate a 50% duty cycle. As it is duty cycle, rather than average DC voltage, that cause deterministic jitter and other denigrating effects, a measure that directly indicated duty cycle is required.

Making assumptions about the shape of the wave form results in inaccuracies. In order to increase accuracy, what is needed, and is not found in the prior art, is a means of assuring an accurate shape for the waveform. One way of assuring accuracy has been found to be via the use of a digital sampling device. The output of the digital sampling device is controlled so that the shape is predictable and accurate. At that point, the desired waveform is produced with accuracy and averaging is done without error.

What is also needed is accurate measurement of the duty cycle using a clocking signal having minimal hardware.

SUMMARY OF THE INVENTION

An object of the present invention is to obtain an accurate and efficient measure of the duty cycle of an applied input signal.

Another object of the present invention is to create a structure that operates accurately over a broad range of applied input signal frequencies.

Another object of the present invention is to create method and structure that can accomplish its objectives while being easily implemented and using a small amount of electronic circuitry.

The objects of this invention are accomplished by, in one exemplary embodiment, randomly sampling the input signal with a sampling clock whose average frequency is significantly lower than the applied input signal frequency and whose exact frequency varies, but whose value is never a precise frequency, and whose value is not normally the same as the input signal. Specifically, the frequencies are not the same. Once digitally sampled, the ratio of the average sample values is determined to computer the duty cycle ratio.

A number of alternatives to accomplish the objects are employed within the spirit and scope of this invention. For example, measuring the average DC-voltage value of the sampled result and comparing it to the known DC-voltage values of a low-sampled value and a high-sampled value to compute a ratio of Vdc/(Vhi−Vlo) which is a direct measure of the duty cycle.

In an alternate exemplary embodiment, the apparatus of the invention includes digital counters running at potentially significantly lower-speed logic family to count the ratio of logic 1's or 0's compared to the number of all samples taken and averaging this over a period.

In another exemplary embodiment the function includes a built-in calibration mechanism for very high-speed signal processing as maintaining an accurate clocking duty cycle is vital to many high-speed processing steps. In such exemplary embodiments, the duty cycle of an internal or external signal is often adjustable and an accurate duty cycle measurement is needed to be able to know what setting is correct.

A limiting amplifier is a device whose output is dependent only on the threshold being applied to the input signal. Once the applied input signal is above the logic threshold of the limiting amplifier, the output stage of the limiting amplifier goes to its 1 or 0 limit voltage and stays there until the opposite condition is met. The input waveform may be a sine wave, square wave, triangle wave, etc. and all would give the same limited (square) output dependent only on how the edges compare to the logic threshold.

However, even this device, though can reach its technological limit where some non-ideal performance characteristics of the limiting amplifier starts to effect the accuracy of the measurement that can be taken. The impact of these non-ideal effects (e.g. realistically limited rise and fall times) can be reduced to the point of noise if an additional step is taken to increase the time period over which the averages are taken. In this way, any mismatch in rise/fall shape is added-in to the long interval of a greater averaging time period making the variation due to the small difference have a small impact in the overall average value. This can be accomplished by sampling (e.g. using a d-type flip flop before the limiting output function).

The d-type flip flop will sample and hold whether or not the input signal is above a logic threshold when commanded to by an applied clocking input signal. In this fashion, the rising (or falling) edge of a sampling clock would tell the flip flop to sample its input signal being above or below the threshold and would hold this logic value on its voltage-limited output signal until the next sampling edge on the applied clocking input signal. This device clearly creates a well-controlled output wave shape suitable for measuring average DC-voltage across a wide range of input frequencies and enables averaging-out any significance of errors introduced in the processing by the non-idealities of real circuits at these high speeds.

In another exemplary embodiment, the result of the flip flop sampled value is digitally processed. It is desirable, when using digital logic processing elements to use digital processing. In this embodiment, the flip flop is sampled digitally by computing the average voltage over a long period of time. The averaging is done using digital counters which determine the ratio of one or zero sampled values compared to the total number of samples taken. The person skilled in the art will appreciate that such a method accomplishes its objectives in various ways. For example, one way includes counting the number of zero values or the number of one values as well as counting the total number of values. By using suitably slow sampling clocks, these counters are implemented using lower-performance electronics than what is required for the ultra high-speed signals for which the apparatus and method for duty cycle measurement are employed.

The only remaining question is when to perform the sampling function. It is clear that the sampling function cannot be synchronous with the clock to which is to be measured. If this were the case, the sampled data values would not represent the averaged 1- and 0-levels. To assure the sampling represents the proper average, a clocking signal needs to be created that has no relationship to the signal which is to be measured assuring a random sampling of 0 and 1 bits. For fixed data rate applications, such a frequency could be computed and used; however, for variable data rate applications, a fixed chosen frequency may become too close to the operating data rate (or an octave of it) at some particular frequency. Therefore, a means of changing the frequency must be supported. This may be explicit in a design that allows convenient frequency changes for the sampling function or it may be implemented by having a randomly varying clocking frequency being always employed. By using a randomly varying clock frequency, no applied user data rate application would ever land at this same frequency or any amount of time that was meaningful, providing a non-synchronous sampling for all applications. In this way, the result of the sampling which comes out the voltage-limited output of the sampler does represent the average signal. Therefore, measuring the averaged DC-voltage of the voltage output of the limited sampler will produce a measure of the duty cycle of the applied input signal.

This invention, then, employs a sampling flip flop, a derived sampling clock, a low-pass filter or digital counters to accomplish voltage averaging and, in the case of analog low-pass filter averaging, a means to know the measured voltages of an all-ones and all-zeros signal.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein.

DETAILED DESCRIPTION OF THE INVENTION

The invention will now be described in greater detail with reference to the accompanying drawings, in which the exemplary embodiments of the invention are shown. The present invention may, however, be embodied in many different forms and should not be construed as limited to the embodiment set forth herein; rather these embodiments are provided so that this disclosure will be thorough and complete and will fully convey the invention to those skilled in the art.

Figure 1:
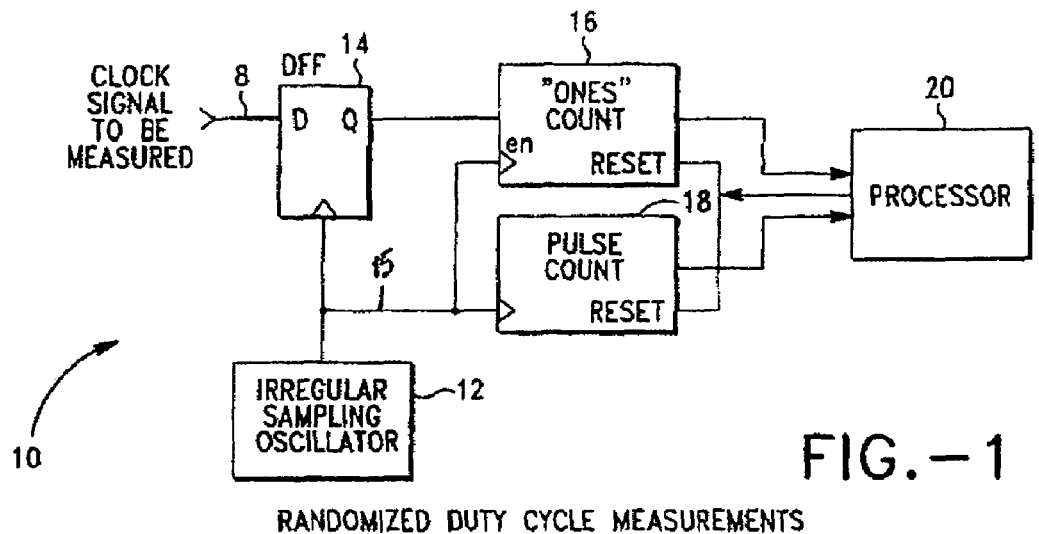
FIG. 1 is a schematic representation of the apparatus in accordance with the present invention for measuring the duty cycle of a high-frequency clock signal.

FIG. 1 is a schematic representation of the invention, a measuring device. The invention measures the duty cycle of a high-frequency clock signal 8 with very minimal hardware. The measuring device accomplishes its objectives by utilizing an irregular (non-coherent) sampling clock oscillator and straightforward flip flops, counters and processing elements.

The measuring device will now be described with respect to FIGS. 1-3, which illustrates an exemplary embodiment of the invention shown generally by the numeral 10. The measuring device 10 includes an irregular (non-coherent) sampling clock oscillator 12 and D flip flop 14, a 1's counter 16, a pulse counter 18 and a processor 20.

The clock signal 8 is applied to the input of a D flip flop 14. In an exemplary embodiment, the quality of the flip flop 14 is commensurate with the high-speed frequency present in the clock signal 8. Upon further study, it will be appreciated that as a result of the exemplary design employed herein other processing elements may perform at greatly reduced speeds. Therefore, logic elements other than the D flip flop 14, are implemented with slower logic elements to provide a cost savings.

The sampled output of the d-type flip flop 14 is then used as an enable for a counter 16 such that when this signal is high (or low) when the rising edge of the counter clock occurs, the counter 16 is instructed to count. The counter clock signal 15 comes from another logic element. This logic element is called the irregular (or non-coherent) clock signal 15 whose frequency is not pure and whose change in frequency (frequency variation) is in no-way coherent to the clocking signal whose duty cycle is measured. The measuring device 10 accomplishes this by having a large random frequency modulation component on the clock. Other means to create a non-coherent clock are anticipated such as using triangular or sinusoidal modulation of the sampling clock frequency.

In all embodiments the sampling clock frequency should not be coherent with the clock signal whose duty cycle is being measured to avoid any type of sampling "beat" frequencies that might occur if the signals are in any way related.

The non-coherent sampling clock 12 is used in three places in this invention. The first is as the sampling point for the primary d-type flip flop 14. It is on the rising edges of this non-coherent clock that the primary sampling d-type flip flop will sample the input signal and copy the logic level of the input to it's output and hold it there until the next sampling event (rising clock edge). The sampling clock 12 is also provided to the "ones" counter circuit 16 to be used to instruct the counter when to potentially increment it's count accumulation. It will be noted that counter 16 will only count on the rising edge of the applied sampling clock signal if, and only if, at that instant the enable bit (which is derived from the sampled input signal from the primary d-type flip flop) is high (or low) at the same time. The third use of the non-coherent sampling clock 12 is to go to another counter which is a free-running counter that will always increment at each clock cell of the sampling clock, for example, pulse counter 18.

In this fashion, for a period of time defined by when the two counters are not forced into reset states, the pulse counter 18 will count the number of samplings and the "ones" counter 16 will count the number of times the sampled result was a logic one (or zero) for each of these samplings.

A processor 20 is used to gate-on the measurement circuit by removing the reset voltage signal and, when completed, can read the results of the two counters 16 and 18 and use these results to compute a ratio of the number of ones (or zeros) count to the total number of samplings count which can then be expressed as a percent and which corresponds to the duty cycle percentage of ones to zeros (or zeros to ones) of the input clock signal 8.

For example, if the number of ones counts were precisely one-half the total number of samplings count, then one would know that the duty cycle of the applied input clock signal was 50%. If the number of ones counts were only one-third of the total number of samplings count, then the duty cycle of the applied input clock signal would be computed as 33%

Figure 2:
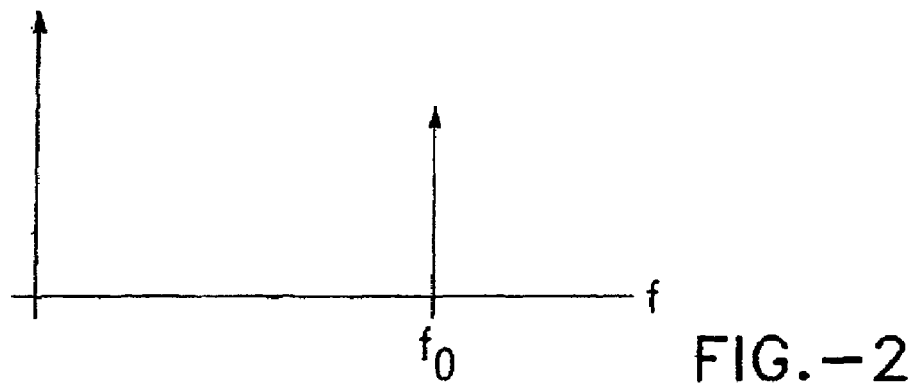
FIG. 2 is a graphic illustration of the frequency spectrum of a nominally pure sampling oscillator.

FIG. 2 illustrates an example spectrum of a sampling clock that is not suitable for measurement by measuring device 10. The graph plots signal amplitude versus frequency. In normal uses of the measuring device 10, the spectrum which plots a pure clocking frequency such as that illustrated in FIG. 2 will beat against the applied input frequency, if used directly. As noted above, this will not be suitable for measuring device 10. However, it is possible to manage even this situation in cases where the applied input frequency is known and non-continuously variable (e.g. a fixed frequency signal is to be measured). However, in applications where the signal to be measured varies greatly in frequency and could be of any frequency, then the applied input frequency cannot be a fixed frequency and must, too, vary considerably and therefore measuring device 10 would not be appropriate for this situation.

In these cases, the frequency of the signal to be measured is known and a pure sampling clock frequency is used as long as the sampling clock frequency is not the same or related to the signal to be measured. For example, by related it is meant that it is not an octave of the frequency of the signal to be measured. In an exemplary embodiment, the frequency of the sampling clock is purposefully set as far away from any octave of the signal to be measured. It will be appreciated that in such case, the frequency of the signal to be measured is known apriori. That way the sampling clock frequency and the signal to be measured do not become at or near each other.

Figure 3:
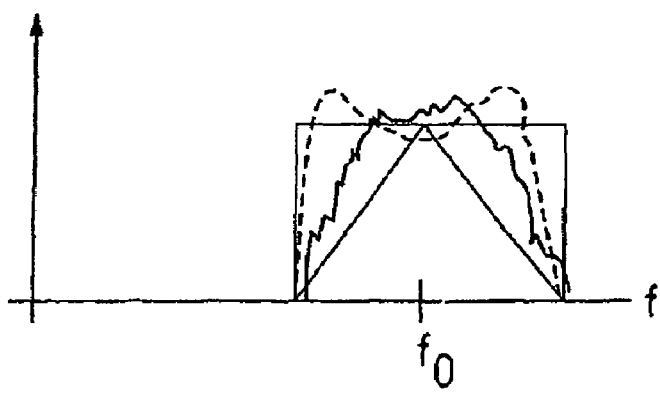
FIG. 3 illustrates various frequency spectrums of irregular sampling clocks.

FIG. 3 illustrates examples of sampling clock frequency spectrum that are more appropriate for this invention. For instance, frequency distributions about some sampling frequency, $f_o$, that may be evenly distributed, sinusoidally distributed or randomly distributed. Each of these, and others not described in FIG. 3, that meet the requirement of being non-coherent, are suitable for use as sampling clocks for this invention. It will be appreciated that there is not a single one-frequency present in the sampling clock. Rather, as shown in the example of FIG. 3, there is a distribution of many frequencies. This means that even if there were a possibility that some frequency was an octave of the signal to be measured, it would only occur for an instant and would be averaged-out because the sampling frequency is constantly changing.

What is claimed is:

1. A duty cycle measuring device, comprising:
   a logic device, coupled to an input signal, outputting a sampled input signal in response to a non-coherent sampling clock signal, the non-coherent sampling clock signal frequency being different than the input signal frequency, the non-coherent sampling clock signal being generated by an irregular sampling oscillator having a randomly varying frequency;
   a counter, which counts the number of times the sampled input signal has a predetermined logic value in response to the non-coherent sampling clock signal, wherein an input of the counter is coupled to the output of the logic element, and a clock input of the said counter is coupled to the non-coherent sampling signal;
   a pulse counter that counts the number of times the input signal is sampled, wherein an input of the pulse counter is coupled to the non-coherent sampling signal, and
   a processor that provides the duty cycle of the input signal in response to a counter output and a pulse counter output.

2. The duty cycle measuring device of claim 1, wherein the non-coherent sampling clock signal has a frequency variance that is not coherent to the input signal frequency variance.

3. The duty cycle measuring device of claim 1, wherein the counter increments in response to the non-coherent sampling clock signal, when the sampled input signal has a logic one value.

4. The duty cycle measuring device of claim 1, wherein the counter increments in response to the non-coherent sampling clock signal, when the sampled input signal has a logic zero value.

5. The duty cycle measuring device of claim 1, wherein the processor determines the duty cycle of the input signal by generating the ratio of the counter output to the pulse counter output.

6. The duty cycle measuring device of claim 1, wherein the irregular sampling oscillator further comprises a random frequency modulation element.

7. The duty cycle measuring device of claim 1, wherein the irregular sampling oscillator further comprises a triangular modulation element.

8. The duty cycle measuring device of claim 1, wherein the irregular sampling oscillator further comprises a sinusoidal modulation element.

9. The duty cycle measuring device of claim 1, wherein the ones counter provides a count value equal to the number of times the sampled input signal has a logic one value, the ones counter incrementing the count value in response to the rising edge of the non-coherent sampling clock signal;

the pulse counter provides the total number of times the non-coherent sampling clock signal is generated; and the processor generates the duty cycle of the input signal in response to the count value of the ones counter and the output of the pulse counter.

10. The duty cycle measuring device of claim 1, wherein the logic device is a d-type flip flop.

11. The duty cycle measuring device of claim 1, wherein the irregular sampling oscillator further comprises a random frequency modulation element.

12. The duty cycle measuring device of claim 1, wherein the irregular sampling oscillator further comprises a triangular modulation element.

13. The duty cycle measuring device of claim 1, wherein the irregular sampling oscillator further comprises a sinusoidal modulation element.

14. The duty cycle measuring device of claim 1, wherein the processor provides a reset signal to the ones counter and the pulse counter, the reset signal causing the ones counter and the pulse counter to reset to a count value of zero.

15. The duty cycle measuring device of claim 9, wherein the ones counter provides a count value equal to the number of times the sampled input signal has a logic zero value, the ones counter incrementing the count value in response to the rising edge of the non-coherent sampling clock signal.

16. A duty cycle determination method, comprising:

receiving an input signal;

sampling the input signal in response to a non-coherent sampling clock signal, the non-coherent sampling clock signal having a frequency that is not coherent to the frequency of the input signal;

incrementing a count value, in response to the non-coherent sampling clock signal, when the sampled signal has a logic one value;

incrementing a pulse count value in response to the non-coherent sampling clock signal; and providing the duty cycle of the input signal by determining a value equal to the ratio of the count value and the pulse count value.

17. The duty cycle determination method of claim 16, wherein the count value is only incremented on the rising edge of the non-coherent sampling clock signal.

18. The duty cycle determination method of claim 16, wherein during the count value incrementing step, the count value is incremented, in response to the non-coherent sampling clock signal, when the sampled input signal has a logic zero value.

* * * * *